United States Patent [19]

Duttweiler

[11] 4,189,715
[45] Feb. 19, 1980

[54] μ-LAW TO FLOATING POINT CONVERTER
[75] Inventor: Donald L. Duttweiler, Rumson, N.J.
[73] Assignee: Bell Telephone Laboratories, Incorporated, Murray Hill, N.J.
[21] Appl. No.: 948,328
[22] Filed: Oct. 4, 1978
[51] Int. Cl.² .......................................... H03K 13/24
[52] U.S. Cl. ............................................ 340/347 DD
[58] Field of Search ............ 340/347 DD; 325/38 K, 325/38 A, 38 B

[56] References Cited
U.S. PATENT DOCUMENTS
3,825,924  7/1974  Montgomery ............... 340/347 DD

*Primary Examiner*—Charles D. Miller
*Attorney, Agent, or Firm*—Richard J. Roddy

[57] ABSTRACT

In PCM systems, it is known to convert μ-law digital code words including a sign bit, m characteristic bits, and n mantissa bits representing respectively the polarity, segment value, and quantizing step of a quantized analog sample into a binary floating point representation thereof including a sign, exponent, and mantissa in order to process the digital signal. Known converters are of two relatively expensive types: (1) using a memory having $2^{m+n}$ locations or (2) employing a μ-law to fixed point conversion followed by fixed point to floating point conversion. To mitigate such drawbacks, the present converter (100) employs a relatively inexpensive translator (200) for translating the segment value and a prefixed quantizing step into a reference mantissa. The code word quantizing step is then added (90, 95) to the reference mantissa to provide the floating point mantissa. The exponent is equal to the segment value; and the sign bit represents the sign. The translator may be implemented, for example, by using a memory having $2^m$ locations or by simple combinatorial logic.

4 Claims, 4 Drawing Figures

8 BIT μ-LAW-POSITIVE OUTPUT LEVELS
$$Y(L,V) = 2^L(V+16.5) - 16.5 = 2^L U(L,V)$$

| V \ L | 0 | 1 | 2 | 3 | 4 | 5 | 6 | 7 |
|---|---|---|---|---|---|---|---|---|
| 0 | 0. | 16.5 | 49.5 | 115.5 | 247.5 | 511.5 | 1039.5 | 2095.5 |
| 1 | 1. | 18.5 | 53.5 | 123.5 | 263.5 | 543.5 | 1103.5 | 2223.5 |
| 2 | 2 | 20.5 | 57.5 | 131.5 | 279.5 | 575.5 | 1167.5 | 2351.5 |
| 3 | 3 | 22.5 | 61.5 | 139.5 | 295.5 | 607.5 | 1231.5 | 2479.5 |
| 4 | 4 | 24.5 | 65.5 | 147.5 | 311.5 | 639.5 | 1295.5 | 2607.5 |
| 5 | 5 | 26.5 | 69.5 | 155.5 | 327.5 | 671.5 | 1359.5 | 2735.5 |
| 6 | 6 | 28.5 | 73.5 | 163.5 | 343.5 | 703.5 | 1423.5 | 2863.5 |
| 7 | 7 | 30.5 | 77.5 | 171.5 | 359.5 | 735.5 | 1487.5 | 2991.5 |
| 8 | 8 | 32.5 | 81.5 | 179.5 | 375.5 | 767.5 | 1551.5 | 3119.5 |
| 9 | 9 | 34.5 | 85.5 | 187.5 | 391.5 | 799.5 | 1615.5 | 3247.5 |
| 10 | 10 | 36.5 | 89.5 | 195.5 | 407.5 | 831.5 | 1679.5 | 3375.5 |
| 11 | 11 | 38.5 | 93.5 | 203.5 | 423.5 | 863.5 | 1743.5 | 3503.5 |
| 12 | 12 | 40.5 | 97.5 | 211.5 | 439.5 | 895.5 | 1807.5 | 3631.5 |
| 13 | 13 | 42.5 | 101.5 | 219.5 | 455.5 | 927.5 | 1871.5 | 3759.5 |
| 14 | 14 | 44.5 | 105.5 | 227.5 | 471.5 | 959.5 | 1935.5 | 3887.5 |
| 15 | 15 | 46.5 | 109.5 | 235.5 | 487.5 | 991.5 | 1999.5 | 4015.5 |
| STEP SIZE | 1 | 2 | 4 | 8 | 16 | 32 | 64 | 128 |

| V \ L | 0 | 1 | 2 | 3 | 4 | 5 | 6 | 7 |
|---|---|---|---|---|---|---|---|---|
| 0 | 0 | 8 1/4 | 12 3/8 | 14 7/16 | 15 15/32 | 15 63/64 | 16 31/128 | 16 95/256 |
| 1 | 1 | 9 1/4 | 13 3/8 | 15 7/16 | 16 15/32 | 16 63/64 | 17 31/128 | 17 95/256 |
| 2 | 2 | 10 1/4 | 14 3/8 | 16 7/16 | 17 15/32 | 17 63/64 | 18 31/128 | 18 95/256 |
| 3 | 3 | 11 1/4 | 15 3/8 | 17 7/16 | 18 15/32 | 18 63/64 | 19 31/128 | 19 95/256 |
| 4 | 4 | 12 1/4 | 16 3/8 | 18 7/16 | 19 15/32 | 19 63/64 | 20 31/128 | 20 95/256 |
| 5 | 5 | 13 1/4 | 17 3/8 | 19 7/16 | 20 15/32 | 20 63/64 | 21 31/128 | 21 95/256 |
| 6 | 6 | 14 1/4 | 18 3/8 | 20 7/16 | 21 15/32 | 21 63/64 | 22 31/128 | 22 95/256 |
| 7 | 7 | 15 1/4 | 19 3/8 | 21 7/16 | 22 15/32 | 22 63/64 | 23 31/128 | 23 95/256 |
| 8 | 8 | 16 1/4 | 20 3/8 | 22 7/16 | 23 15/32 | 23 63/64 | 24 31/128 | 24 95/256 |
| 9 | 9 | 17 1/4 | 21 3/8 | 23 7/16 | 24 15/32 | 24 63/64 | 25 31/128 | 25 95/256 |
| 10 | 10 | 18 1/4 | 22 3/8 | 24 7/16 | 25 15/32 | 25 63/64 | 26 31/128 | 26 95/256 |
| 11 | 11 | 19 1/4 | 23 3/8 | 25 7/16 | 26 15/32 | 26 63/64 | 27 31/128 | 27 95/256 |
| 12 | 12 | 20 1/4 | 24 3/8 | 26 7/16 | 27 15/32 | 27 63/64 | 28 31/128 | 28 95/256 |
| 13 | 13 | 21 1/4 | 25 3/8 | 27 7/16 | 28 15/32 | 28 63/64 | 29 31/128 | 29 95/256 |
| 14 | 14 | 22 1/4 | 26 3/8 | 28 7/16 | 29 15/32 | 29 63/64 | 30 31/128 | 30 95/256 |
| 15 | 15 | 23 1/4 | 27 3/8 | 29 7/16 | 30 15/32 | 30 63/64 | 31 31/128 | 31 95/256 |

# μ-LAW TO FLOATING POINT CONVERTER

TECHNICAL FIELD

This invention relates to digital signal processing and, more particularly, to the converting of a μ-law code word into a floating point representation thereof.

BACKGROUND OF THE INVENTION

Pulse code modulation (PCM) signals consist, in general, of a series of binary code words wherein each word represents an instantaneous value of a periodically sampled and quantized analog signal. In normal usage these code words are transmitted in the form of a serial bit stream to a receiving station where they are decoded into a reconstructed version of the original analog signal. In between, the processing of the digital signal usually involves various operations being performed on the PCM words. For example, the present inventor in "A Twelve-Channel Digital Echo Canceler", *IEEE Transactions on Communications*, Vol. COM-26, No. 5 (May 1978), pp. 647-653 discloses an echo canceller employing floating point multipliers. However, the typical PCM word is not in a floating point representation. Hence, a converting operation need be performed to convert the PCM code word into a floating point representation thereof. A floating point representation of a number z is a representation of the form $$z = S \cdot A \cdot B^\alpha \qquad (1)$$

where S is the polarity, or sign, of the number; A is its mantissa; B is its base, which generally equals two in a binary system; and $\alpha$ is its exponent.

Where the PCM code is linear, i.e., having no compression or expansion, a simple shifting of the binary digits can produce a multiplication or division in powers of two. A linear code is therefore readily adapted to a floating point representation. On the other hand, where the PCM code is nonlinear, e.g., a compressed code, a simple shift does not produce a uniform multiplication or division. The telecommunications art usually employs a nonlinear PCM code.

In a special issue on digital signal processing, an article by A. Kundig, "Digital Filtering in PCM Telephone Systems", *IEEE Transactions on Audio and Electroacoustics*, Vol. AU-18, No. 4 (December 1970), pp. 412-417 discloses a method for converting a nonlinear PCM word, encoding according to the so-called A-law, into a floating point number representation. The Kundig method succeeds, in part, because of the close relationship between A-law encodings and floating point encodings.

A second nonlinear PCM code, known as the μ-law, approximates the compression function:

$$y = \frac{\log(1 + \mu x)}{\log(1 + \mu)}. \qquad (2)$$

Known μ-law to floating point converter arrangements are of two types. One type includes a memory which, responsive to the PCM word, has extended from a location therein the floating point representation. For a common 8-bit PCM word having one sign bit such arrangements typically employ a memory having at least $2^7$ locations, each location with an eight bit floating point representation. The second type is a two stage converter including a μ-law to fixed point conversion followed by a fixed point to floating point conversion. Hence, known μ-law to floating point converters tend to be expensive.

SUMMARY OF THE INVENTION

This and other problems are mitigated in accordance with the principles of my invention by an improved μ-law to floating point converter. The converter includes a translator for providing a reference mantissa in response to the segment value of the μ-law code word and to a prefixed quantizing step. The floating point mantissa is then obtained by adding the reference mantissa and the quantizing step of the code word. The floating point exponent is the segment value; while the floating point sign is equal to the sign of the code word.

BRIEF DESCRIPTION OF THE DRAWING

The various features of the present invention will be readily understood from the following detailed description taken in conjunction with the drawings in which:

FIG. 3 is a table which shows the value of the reference and floating point mantissas for a $\mu = 255$, μ-law code.

DETAILED DESCRIPTION

In considering nonlinear PCM codes, a typical compressed PCM code X(L, V) comprises m binary digits, called "characteristic bits" for representing a segment L, and n binary digits, called "mantissa bits" for representing a quantizing step V in segment L. In addition, it is common that the compressed code include a single polarity bit S. The resultant code word is then a bit stream of length (m+n+1) bits. Also, the total number M of segments in one polarity is equal to $2^m$ and the total number N of quantizing steps in each segment is equal to $2^n$.

Figures 1, 2:
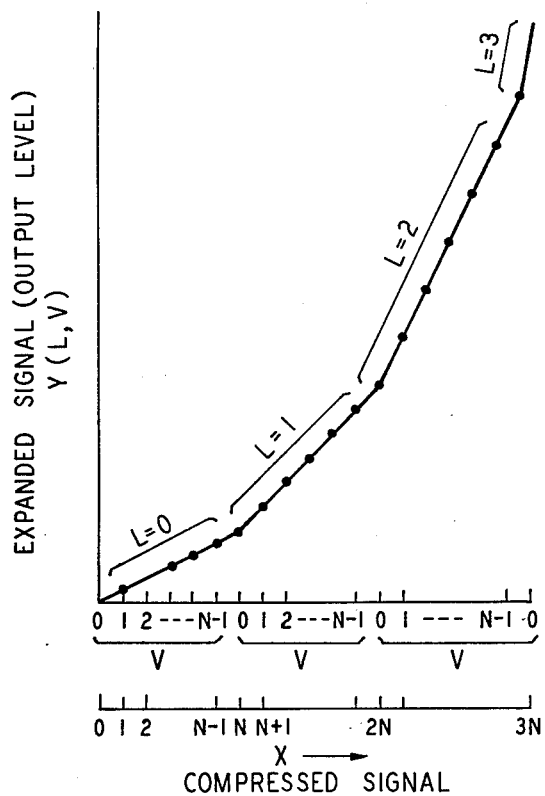
FIG. 1 is a diagram illustrating a μ-law code.
FIG. 2 is a table which shows the analog output levels for a $\mu = 255$, μ-law code.

The usual compressed digital signal is then given by $$X(L, V) = V + NL \qquad (3)$$

and the expanded, or linearized, signal is given by $$Y(L, V) = \Delta L(V + P) - Q \qquad (4)$$

where for the μ-law $$\Delta L = 2^L$$

$$P = N + a$$

$$Q = N + a - c$$

where a is the segment edge parameter, i.e., the transition from one segment to the next, and c is the centering parameter, i.e., the off-set of the curve from the origin. In FIG. 1 there is shown a representation of a μ-law characteristic curve where c=0. Henceforth, and without loss of generality but rather for ease of description, we consider c=0 and a=0.5. Furthermore, to simplify the discussion that follows, we assume N=16 (n=4) and M=8 (m=3). Hence, the expanded, or linearized, signal of equation (4), with the aforementioned assumptions incorporated and ignoring momentarily the sign bit, is given by $$Y(L, V) = 2^L(V + 16.5) - 16.5.  \quad (5)$$

The polarity of sign, bit is the eighth bit of the PCM code word. The foregoing assumptions are common to the 8-bit, $\mu = 255$ PCM code word which is used by the Bell System in its digital carrier facilities and which is characterized by a bit stream of the form $SL_1L_2L_3V_1V_2V_3V_4$ where S is the sign bit; $L_1L_2L_3$ define the particular segment L of the code and are the (m=) three characteristic bits; and $V_1V_2V_3V_4$ define the quantizing step V and are the (n=) four mantissa bits.

FIG. 2 is a table which shows the analog output levels Y(L, V) from equation (5). From the table it can be seen that a 13-bit linear code will represent the range of values encompassed by the magnitude of the analog signal. Equation (5) can be rewritten in floating representation as $$Y(L, V) = 2^L U(L, V) \quad (6)$$

where the exponent L is the segment value and the floating point mantissa U(L, V) is given as:

$$U(L, V) = V + 16.5 - 2^{-L}(16.5).  \quad (7)$$

It should be noted that the mantissa of equation (7) can itself be rewritten as $$U(L, V) = U(L, 0) + V \quad (8)$$

where U(L, 0) is a reference mantissa having the value of the floating point mantissa for a particular quantizing step, here for V=0. FIG. 3 is a table which shows the floating point mantissa values from equation (7). It should be observed that the first row of the table in FIG. 3 provides the values of the reference mantissa U(L, 0). It is clear that equation (8) can be solved by simply adding quantizing step V to the reference mantissa shown illustratively as the first row value from FIG. 3. It should also be observed that the magnitude of the difference between U(L, V) and its closest, nearly integer (i.e., closest larger or smaller integer as the case may be) does not exceed 15/32. Using the latter observation, consider the set of consecutive integers {0, 1, 2, ..., 31}. Let $U_5$(L, V) denote the integer from the set which integer is the integer closest to U(L, V). Referencing the table in FIG. 3 and the set {0, 1, 2, ..., 31} it becomes clear that the magnitude of the observed difference between U(L, V) and $U_5$(L, V) is less than one-half a quantizing step, i.e., $$|U(L, V) - U_5(L, V)| \leq 15/32 < \tfrac{1}{2}.  \quad (9)$$

As a result, U(L, V) can be approximated by $U_5$(L, V) and yet introduce an error no larger than one-half quantizing step. Noteworthy an error of such magnitude is possible in the original quantization. Fortuitously and consistent with the principles of my invention, the expanded signal Y(L, V) can be provided by way of equation (6) using $U_5$(L, V) as an approximation of U(L, V) thereby obtaining the floating point representation $2^L U_5$(L, V). Also, $U_5$(L, V) can be provided using inexpensive memory or combinatorial apparatus together with simple adder apparatus. Too, only five bits are needed to specify $U_5$(L, V).

Figure 4:
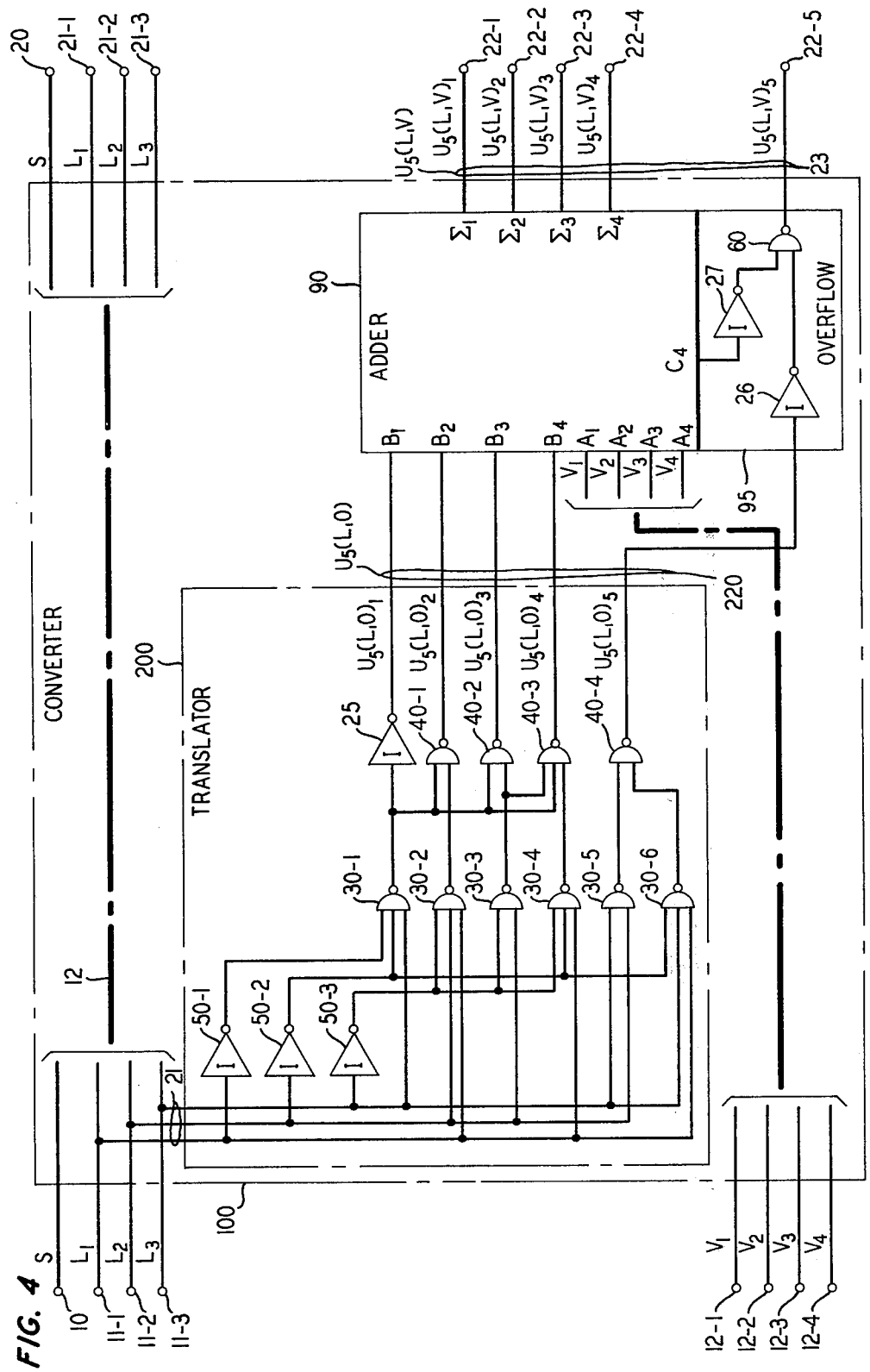
FIG. 4 is a diagram illustrating apparatus for converting a μ-law code word into a floating point representation thereof in accordance with the principles of my invention.

FIG. 4 includes illustrative apparatus incorporating the principles of my invention. A PCM code word with sign bit S; characteristic bits $L_1, L_2, L_3$ for representing segment L; and mantissa bits $V_1, V_2, V_3, V_4$ for representing quantizing step V is provided to respective, parallel input terminals 10; 11-1, 11-2, 11-3; and 12-1, 12-2, 12-3, 12-4 of converter 100, processed thereby and provided as a floating point representation including sign bit S; characteristic bits $L_1, L_2, L_3$ for representing the exponent; and five-bit floating point mantissa $U_5$(L, V) having bits $U_5(L, V)_1$ through $U_5(L, V)_5$ respectively to parallel output terminals 20; 21-1, 21-2, 21-3; and 22-1 through 22-5 for extension to floating point apparatus, not shown. More particularly, mantissa bits $V_1, V_2, V_3, V_4$ are extended in parallel from input terminals 12-1, 12-2, 12-3, 12-4 to respective first inputs of adder 90. Characteristic bits $L_1, L_2, L_3$ are extended from input terminals 11-1, 11-2, 11-3 jointly to exponent output terminals 21-1, 21-2, 21-3 and to first inputs of translator 200 for providing a 5-bit approximation $U_5$(L, 0) of reference mantissa U(L, 0). Specifically, translator 200, responsive to input segment value L, extends an output reference mantissa $U_5$(L, 0) in accord with the translation set forth in Table I below:

TABLE I

| L | $U_5$(L, 0) |
|---|---|
| 0 | 0 |
| 1 | 8 |
| 2 | 12 |
| 3 | 14 |
| 4 | 15 |
| 5 | 16 |
| 6 | 16 |
| 7 | 16 |

Table I, it will be seen, reflects the values of U(L, 0) from the first row of the table in FIG. 3, rounded to the closest integer. Translator 200 may be implemented by a memory device or by relatively inexpensive combinatorial logic. Noteworthy, rather than requiring the prior art $2^{(m+n=)7}$ memory locations, converter 100, when implemented using a memory for translator 200, requires only $2^{(m=)3}$ memory locations. My illustrative embodiment of translator 200 is by way of combinatorial logic for providing an output $U_5$(L, 0) in accord with Table I responsive to a segment value L.

The output of translator 200 is extended in parallel to second inputs of adder 90. In accord with equation (8), the output of adder 90 is $U_5$(L, V) for extension to the output terminals 22-1 through 22-5 concurrently with characteristic bits $L_1, L_2, L_3$ and sign bit S being extended respectively to output terminals 21-1, 21-2, 21-3 and 20. Advantageously, no clocking logic is needed to convert the $\mu$-law code word into a floating point representation thereof.

To still more particularly illustrate the operation of illustrative converter 100, its operation in providing a floating point representation of an expanded signal Y(L, V) having L=5 and V=6 is described. First, turning to FIG. 2, the value of the linearized signal Y(5, 6) is 703.5 while from FIG. 3 the values of U(5, 0) and U(5, 6) are respectively 15-63/64 and 21-63/64. Clearly U(5, 6)=U(5, 0)+6 in accord with equation (8). Using a five bit approximation for U(5, 6) and from Table I above, translator 200 is to provide a value $U_5$(5, 0)=16 which in binary format "$U_5(5, 0)_5, U_5(5, 0)_4, \ldots, U_5(5, 0)_1$" equals the bitstream "10000". Using the $\mu$-law to floating point converter of FIG. 4, a floating point representation equivalent to a value of Y(5, 6) equaling 704 is extended to the output terminals of converter 100. That is, referring to equation (1), the polarity is extended to terminal 20; the exponent is extended as a segment value L=5, which in binary is the bitstream "101", to terminals 21-1, 21-2, 21-3; and the floating point mantissa is extended as a value $U_5(5, 6)=16$, which in binary is the bitstream "10000", to terminals 22-5 to 22-1 respectively. To obtain $U_5(5, 6)$, in accord with equation (8), mantissa bits $V_1$, $V_2$, $V_3$, $V_4$ are extended from terminals 12-1 through 12-4 to respective first inputs of a standard binary adder 90. Adder 90, may for example, be a conventional adder, such as the four bit Texas Instrument adder 74283 having coupled thereto overflow logic 95 including inverters 26 and 27 and NAND gate 60 for providing a logic one, as bit $U_5(L, V)_5$ to terminal 22-5, when either bit $U_5(L, 0)_5$ is a logic one or there is a carry logic one from adder 90. In order to obtain $U_5(L, V)$, the reference mantissa $U_5(L, 0)$ is extended from translator 200 to respective second inputs of adder 90. The reference mantissa is determined by inverters 20 and 25, NAND gates 30 and 40, included within translator 200. In particular, a segment value L=5 is extended in binary form "101" from respective inputs 11-1, 11-2 and 11-3 of converter 100. Bit $L_1$, being a binary one, is extended to first inputs of NAND gates 30-2, 30-4 and 30-6 and, after inversion by inverter 50-1, is extended as a binary zero to a first input of NAND gate 30-1. Segment bit $L_2$, being a binary zero, is extended to a second input of NAND gate 30-2 and a first input of NAND gates 30-3 and 30-5 and, after being inverted to a binary one by inverter 50-2, to a second input of NAND gates 30-1, 30-4 and 30-6. Segment bit $L_3$, being a binary one, is extended to a third input of NAND gates 30-1 and 30-6 and a second input of NAND gate 30-5 and, after being inverted to a binary zero by inverter 50-3, to a third input of NAND gates 30-2 and 30-4 and a second input of NAND gate 30-3. It being well known that the output of a NAND gate is a logic one if any input is a logic zero, the outputs of NAND gates 30-1, 30-2, 30-3, 30-4, 30-5 are logic ones while the output of gate 30-6 is a logic zero. The NAND gate outputs are inverted by inverter 25 and NAND gates 40-1, 40-2, 40-3, 40-4 to provide $U_5(6, 0)$ as the bit stream "10000", or $U_5(6, 0)=16$, to the second input of adder 90 as per Table I.

Although the invention has been described and illustrated in detail, it is to be understood that the same is by way of illustration only. Various modifications will occur to those skilled in the art. For example, the approximation of U(L, V) by a five bit integer $U_5(L, V)$ taken from the set of consecutive integers $\{0, 1, 2, \ldots, 31\}$ is only by way of example. The value U(L, V) could be approximated by $U_6(L, V)$, the closest number in the set $\{0, \frac{1}{2}, 1, 1\frac{1}{2}, \ldots, 31, 31\frac{1}{2}\}$ to U(L, V). Only one more bit is needed to specify $U_6(L, V)$ than to specify $U_5(L, V)$. Still further approximations exist. Thus, the spirit and scope of the invention are limited only by the appended claims.

I claim:

1. A μ-law to floating point converter (100) including input terminals (10, 11-1, 11-2, 11-3, 12-1, 12-2, 12-3, 12-4) adapted to receive a μ-law code word, said code word including a sign bit representing polarity, characteristic bits representing segment value, and mantissa bits representing a code word quantizing step;
output terminals (20, 21-1, 21-2, 21-3, 22-1, 22-2, 22-3, 22-4, 22-5) adapted to transmit a floating point representation of said code word, said representation including a sign, an exponent and a floating point mantissa;
means (12) for extending said polarity and said segment value to first predetermined ones (20, 21-1, 21-2, 21-3) of said output terminals and characterized in that said converter further comprises:
a translator (200) responsive to said segment value and to a prefixed quantizing step for providing a reference mantissa;
means (90, 95) responsive to said reference mantissa and to said code word quantizing step for providing said floating point mantissa;
means (23) for extending said floating point mantissa to second predetermined ones (22-1, 22-2, 22-3, 22-4, 22-5) of said output terminals whereby said floating point representation consists of said sign bit (20), said characteristic bits directly extended as said exponent (21-1, 21-2, 21-3), and said extended floating point mantissa (22-1, 22-2, 22-3, 22-4, 22-5).

2. The converter defined in claim 1 wherein said floating point mantissa providing means includes apparatus (90, 95) for adding said reference mantissa and said code word quantizing step.

3. The converter defined in claim 1 wherein said translator (200) includes a memory device for providing said reference mantissa at an output thereof (220) responsive to said segment value extended to an input thereof (210).

4. The converter defined in claim 1 wherein said translator (200) includes apparatus (50, 30, 25, 40) for providing an approximation of said reference mantissa at an output thereof (220) responsive to said segment value extended to an input thereof (210); said approximation being a number from a predetermined set, said number being the number in the set which is closest to said reference mantissa; and means (90, 95) for adding said approximation and said code word quantizing step to obtain a sum;
means (23) for extending said sum to said second predetermined output terminals as said floating point mantissa.

* * * * *